US012189269B2

(12) United States Patent
Yu et al.

(10) Patent No.: US 12,189,269 B2
(45) Date of Patent: Jan. 7, 2025

(54) ORTHOGONAL-PHASE BAGA4SE7 COMPOUND, ORTHOGONAL-PHASE BAGA4SE7 NONLINEAR OPTICAL CRYSTAL AS WELL AS PREPARATION METHOD AND APPLICATION THEREOF

(71) Applicant: Tianjin University of Technology, Tianjin (CN)

(72) Inventors: Hongwei Yu, Tianjin (CN); Zhen Qian, Tianjin (CN); Hongping Wu, Tianjin (CN); Zhanggui Hu, Tianjin (CN)

(73) Assignee: Tianjin University of Technology, Tianjin (CN)

( * ) Notice: Subject to any disclaimer, the term of this patent is extended or adjusted under 35 U.S.C. 154(b) by 600 days.

(21) Appl. No.: 17/410,281

(22) Filed: Aug. 24, 2021

(65) Prior Publication Data

US 2022/0187682 A1 Jun. 16, 2022

(30) Foreign Application Priority Data

Dec. 14, 2020 (CN) .......................... 202011471459.1

(51) Int. Cl.
| | |
|---|---|
| *G02F 1/355* | (2006.01) |
| *C01G 15/00* | (2006.01) |
| *C30B 11/00* | (2006.01) |
| *C30B 11/04* | (2006.01) |
| *C30B 29/46* | (2006.01) |

(52) U.S. Cl.
CPC ......... *G02F 1/3551* (2013.01); *C01G 15/006* (2013.01); *C30B 11/007* (2013.01); *C30B 11/04* (2013.01); *C30B 29/46* (2013.01); *C01P 2002/72* (2013.01); *C01P 2006/60* (2013.01)

(58) Field of Classification Search
None
See application file for complete search history.

(56) References Cited

FOREIGN PATENT DOCUMENTS

WO WO-9315169 A1 * 8/1993 ........ C10M 171/001

OTHER PUBLICATIONS

Zhang et al. "Determination of the nonlinear optical coefficients of the BaGa4Se7 crystal". vol. 23. No. 1, 2014. (Year: 2014).*
Guo, et al. "Synthesis, Growth of Crack-Free Large Size BaGa4Se7. .". Crystal Growth & Design. 19, 1282-1287 (2019) (Year: 2019).*
Yin et al. "Raman Spectra and Phonon Structures of BaGa4Se7"crystal. Communications Physics. Aug. 2019 (Year: 2019).*
Yao et al "Growth and Characterization of BaGa4Se7 crystal". Journal of Crystal Growth. 1-4, 346 (2012). (Year: 2012).*
Yelisseyev et al. "The Optical Properties of the nonlinear crystal BaGa4Se7". Optical materials. 109564. Jan. 2020. (Year: 2020).*

* cited by examiner

*Primary Examiner* — Sheng H Davis
(74) *Attorney, Agent, or Firm* — Pilloff Passino & Cosenza LLP; Rachel K. Pilloff; Sean A. Passino

(57) ABSTRACT

The present invention relates to an orthogonal-phase compound and its nonlinear optical (NLO) crystal of $BaGa_7Se_7$, its producing method and uses thereof. Polycrystalline orthogonal-phase $BaGa_4Se_7$ was prepared by a high-temperature solid-phase reaction in a sealed silica tube. Large size single crystals of orthogonal-phase $BaGa_4Se_7$ could be prepared by the flux method or Bridgman method. $BaGa_4Se_7$ crystallizes in the point group mm2. Orthogonal-phase $BaGa_4Se_7$ has a powder second harmonic generation (SHG) efficiency of about 5 times that of $AgGaS_2$ and is phase-matchable. The orthogonal-phase $BaGa_4Se_7$ is non-hygroscopic and has good mechanical properties, which makes it easy to cut, polish, and coat by normal processing. The orthogonal-phase $BaGa_4Se_7$ crystal has never been cracked during cutting and polishing. The orthogonal-phase compound and NLO crystal of $BaGa_4Se_7$ can be used as NLO devices.

8 Claims, 2 Drawing Sheets

ORTHOGONAL-PHASE BAGA4SE7 COMPOUND, ORTHOGONAL-PHASE BAGA4SE7 NONLINEAR OPTICAL CRYSTAL AS WELL AS PREPARATION METHOD AND APPLICATION THEREOF

CROSS REFERENCE TO RELATED APPLICATION

The present invention relates to orthogonal-phase $BaGa_7Se_7$ compound with a chemical formula of $BaGa_4Se_7$, an orthogonal-phase $BaGa_7Se_7$ nonlinear optical crystal, a preparation method of the crystal and a nonlinear optical apparatus manufactured from the crystal.

BACKGROUND OF THE INVENTION

It has always been a hot topic in the field of laser frequency conversion to explore a new nonlinear optical crystal with a large frequency doubling effect, a wide transmission band, a large optical damage threshold, and stable physical and chemical properties. At present, main nonlinear optical materials include a $\beta$-$BaB_2O_4$ (BBO) crystal, a $LiB_3O_5$ (LBO) crystal, a $CsB_3O_5$ (CBO) crystal, a $CsLiB_6O_{10}$ (CLBO) crystal and a $KBe_2BO_3F_2$ (KBBF) crystal. Although the crystal growth technology of these materials has become increasingly mature, there are still obvious deficiencies such as easy dehydration of crystals, long growth cycles, serious layered growth habits and high prices. Therefore, it is still a very important and arduous task to find new nonlinear optical crystal materials. In order to make up for the deficiencies of the nonlinear optical crystals, scientists from various countries are still paying close attention to the exploration and research of various new nonlinear optical crystals, not only focusing on optical and mechanical properties of crystals, but also paying more and more attention to characteristics of crystal preparation.

So far, the generation of 3-20 μm solid-state mid and far-infrared infrared lasers is mainly based on a nonlinear optical principle and an infrared nonlinear optical crystal frequency conversion technology. In the infrared nonlinear optical crystal market, common infrared nonlinear optical crystals mainly include $AgGaS_2$, $AgGaSe_2$, $ZnGeP_2$ and the like. Although these crystals have been used in high-tech fields and military equipment for civilian production and life, these crystal materials have their own shortcomings, and cannot meet ideal requirements in terms of comprehensive performance With the development of technology and requirements, there are pressing demands for more excellent infrared nonlinear crystals. Therefore, exploration of new mid and far-infrared nonlinear crystals has important strategic significance in civil high-tech industries and upgrading military equipment, and synthesis and growth of crystal materials with excellent properties have huge challenges.

SUMMARY OF THE INVENTION

The first objective of the present invention is to provide a compound with a chemical formula of $BaGa_4Se_7$, and a molecular weight of 968.94. Its single crystal having a non-centrosymmetric structure, belongs to an orthorhombic crystal system, and has a point group of mm2, crystal cell parameters of a=15.438(12) Å, b=7.610(6) Å, c=10.521(7) Å, $\alpha=\beta=\gamma=90°$ and Z=2 and a unit cell volume of V=1236.23(16) Å$^3$. The polycrystalline powder was prepared through a high-temperature solid-state reaction method.

Another objective of the present invention is to provide an orthogonal-phase $BaGa_4Se_7$ nonlinear optical crystal and a preparation method thereof. The crystal has a chemical formula of $BaGa_4Se_7$ and a molecular weight of 968.94, which is a single crystal having a non-centrosymmetric structure, belongs to an orthorhombic crystal system, and has a point group of mm2, crystal cell parameters of a=15.438(12) Å, b=7.610(6) Å, c=10.521(7) Å, $\alpha=\beta=\gamma=90°$ and Z=2 and a unit cell volume of V=1236.23(16) Å$^3$. The preparation method is a solid-phase reaction of single element barium and a barium-containing compound, single element gallium and a gallium-containing compound, and single element selenium and a selenium-containing compound under a vacuum condition. For powder of the orthogonal-phase $BaGa_4Se_7$ compound and orthogonal-phase $BaGa_4Se_7$ nonlinear optical crystal under irradiation of laser with a wavelength of 2090 nm, the frequency doubling effect of $BaGa_4Se_7$ is 5 times that of $AgGaS_2$ under the same condition.

Another objective of the present invention is to provide the use of an orthogonal-phase $BaGa_4Se_7$ nonlinear optical apparatus in manufacturing an infrared communication apparatus, an infrared-waveband laser frequency doubling crystal, an infrared laser guiding apparatus, an upper frequency converter, a lower frequency converter or an optical parametric oscillator.

The present invention adopts the following technical solution:

The orthogonal-phase selenium-gallium-barium $BaGa_4Se_7$ provided by the present invention has a chemical formula of $BaGa_4Se_7$, and its preparation process adopts a high-temperature solid-phase reaction method based on the following steps:

a, uniformly mixing a barium-containing compound or a barium single element, a gallium-containing compound or a gallium single element, a selenium-containing compound or a selenium single element in a gas-tight container with water content and oxygen gas content of 0.01-0.1 ppm, a glove box filled with inert gas argon gas in a molar ratio of 1:4:7 to obtain a mixture, then putting the mixture into a clean graphite crucible, filling the mixture into a quartz glass tube, and sealing after vacuum-pumping the quartz tube filled with raw materials under vacuum degree of $10^{-5}$-$10^{-1}$ Pa;

b, heating up the quartz tube sealed in step a to 400-700° C. from the room temperature at a heat-up rate of 10-40° C. per hour, preserving the heat for 30-60 hours, and then heating up the quartz tube to 800-1000° C. at a heat-up rate of 20-40° C. per hour, and preserving the heat for 70-110 hours; and c, cooling the quartz tube to the room temperature at a cooling rate of 2-7° C. per hour, taking out a sample to pulverize in a mortar box, and grinding to obtain $BaGa_4Se_7$ polycrystalline powder, and performing X-ray analysis on the obtained orthogonal-phase $BaGa_4Se_7$ polycrystalline powder, where an X-ray diffraction pattern is consistent with a theoretical X-ray diffraction pattern of $BaGa_4Se_7$ analyzed by a single-crystal structure.

The barium-containing compound includes at least one of barium fluoride, barium chloride, barium bromide and barium selenide.

The gallium-containing compound includes at least one of gallium fluoride, gallium chloride, gallium bromide and gallium selenide.

The selenium-containing compound includes at least one of barium selenide and gallium selenide.

The orthogonal-phase BaGa$_4$Se$_7$ compound can be prepared by the solid-phase reaction method based on the following chemical reaction formulas:

$$Ba+4Ga+7Se \rightarrow BaGa_4Se_7 \quad\quad 1)$$

$$Ba+2Ga_2Se_3+Se \rightarrow BaGa_4Se_7 \quad\quad 2)$$

$$BaSe+2Ga_2Se_3 \rightarrow BaGa_4Se_7 \quad\quad 3)$$

$$BaF_2+2Ga_2Se_3+1.5Se \rightarrow BaGa_4Se_7+0.5SeF_4\uparrow \quad\quad 4)$$

$$BaF_2+4Ga+7.5Se \rightarrow BaGa_4Se_7+0.5SeF_4\uparrow \quad\quad 5)$$

$$BaCl_2+2Ga_2Se_3+1.5Se \rightarrow BaGa_4Se_7+0.5SeCl_4\uparrow \quad\quad 6)$$

$$BaCl_2+4Ga+7.5Se \rightarrow BaGa_4Se_7+0.5SeCl_4 \quad\quad 7)$$

$$BaBr_2+2Ga_2Se_3+1.5Se \rightarrow BaGa_4Se_7+0.5SeBr_4\uparrow \quad\quad 8)$$

$$BaBr_2+4Ga+7.5Se \rightarrow BaGa_4Se_7+0.5SeBr_4\uparrow \quad\quad 9)$$

The orthogonal-phase BaGa$_4$Se$_7$ nonlinear optical crystal provided by the present invention has a chemical formula of BaGa$_4$Se$_7$ and a molecular weight of 968.94, which is a single crystal having a non-centrosymmetric structure, belongs to an orthorhombic crystal system, and has a point group of mm2, crystal cell parameters of a=15.438(12) Å, b=7.610(6) Å, c=10.521(7) Å, α=β=γ=90° and Z=2, a unit cell volume of V=1236.23(16) Å$^3$, and powder frequency doubling effect thereof is about 5 times that of AGS (AgGaS$_2$).

The orthogonal-phase selenium-gallium-barium BaGa$_4$Se$_7$ nonlinear optical crystal provided by the present invention adopts a sealing tube high temperature solution method or a Bridgman method (descending crucible method) based on the following specific operation steps:

a, In a glove box filled with the inert gas argon and containing 0.01-0.1 ppm water and oxygen, compound BaGa$_4$Se$_7$ polycrystalline powder or a mixture of compound BaGa$_4$Se$_7$ polycrystalline powder and flux obtained in claim 3 is placed in a clean graphite crucible, then the graphite crucible is filled with a quartz tube, and finally the quartz tube is sealed by evacuation with a vacuum degree of 10$^{-5}$-10$^{-1}$ Pa;

or directly putting a mixture of a barium-containing element or a barium single element, a gallium-containing compound or a gallium single element, a selenium-containing compound or a selenium single element and a fluxing agent into a clean graphite crucible, filling the mixture into a quartz glass tube, and sealing after vacuum-pumping a quartz tube filled with raw materials under vacuum degree of 10$^{-5}$-10$^{-1}$ Pa, where the fluxing agent is mainly a selenium or a selenium-containing self-fluxing agent such as Se, Ga$_2$Se$_3$ and BaSe as well as other composite fluxing agents such as Se—Ga$_2$Se$_3$, Se—BaSe, Ga$_2$Se$_3$—BaSe and Se—Ga$_2$Se$_3$—BaSe.

b, heating up the quartz tube sealed in step a to 400-700° C. from the room temperature at a heat-up rate of 10-40° C. per hour, preserving the heat for 30-60 hours, and then heating up the quartz tube to 900-1100° C. at a heat-up rate of 20-40° C. per hour, and preserving the heat for 70-110 hours; and c. cooling the quartz tube to the room temperature at a cooling rate of 2-5° C. per hour to obtain a BaGa$_4$Se$_7$ crystal;

or putting a crucible containing a mixture prepared in step a into a crystal growth furnace, slowly dropping the crystal growth furnace, making the crucible pass through a heating furnace with a certain temperature gradient, and controlling the furnace temperature to be a bit higher than a material melting point; selecting a proper heating region, melting materials in the crucible while the crucible passes through the heating region, vertically dropping the crystal growth device at a rate of 0.1-10 mm/h, firstly reducing the temperature at the bottom of the crucible to be lower than the melting point while the crucible continuously drops, starting crystallization, continuously growing the crystal along with the drop of the crucible, thereby preparing a BaGa$_4$Se$_7$ crystal, where a growth period lasts for 5-20 days.

Use of the orthogonal-phase BaGa$_4$Se$_7$ nonlinear optical apparatus in manufacturing an infrared communication apparatus, an infrared-waveband laser frequency doubling crystal, an infrared laser guiding apparatus, an upper frequency converter, a lower frequency converter or an optical parametric oscillator is provided.

For powder of the orthogonal-phase BaGa$_4$Se$_7$ compound and orthogonal-phase BaGa$_4$Se$_7$ nonlinear optical crystal under irradiation of laser with a wavelength of 2090 nm, the frequency doubling effect of BaGa$_4$Se$_7$ with granularity of 55-88 μm is 5 times that of silver gallium sulfide (AgGaS$_2$) under the same granularity.

In the orthogonal-phase BaGa$_4$Se$_7$ nonlinear optical crystal structure disclosed by the prevent invention, chemical valence of a Ba atom, a Ga atom and a Se atom is separately +2, +3 and −2.

DETAILED DESCRIPTION OF THE PREFERRED EMBODIMENTS

Figure 1:
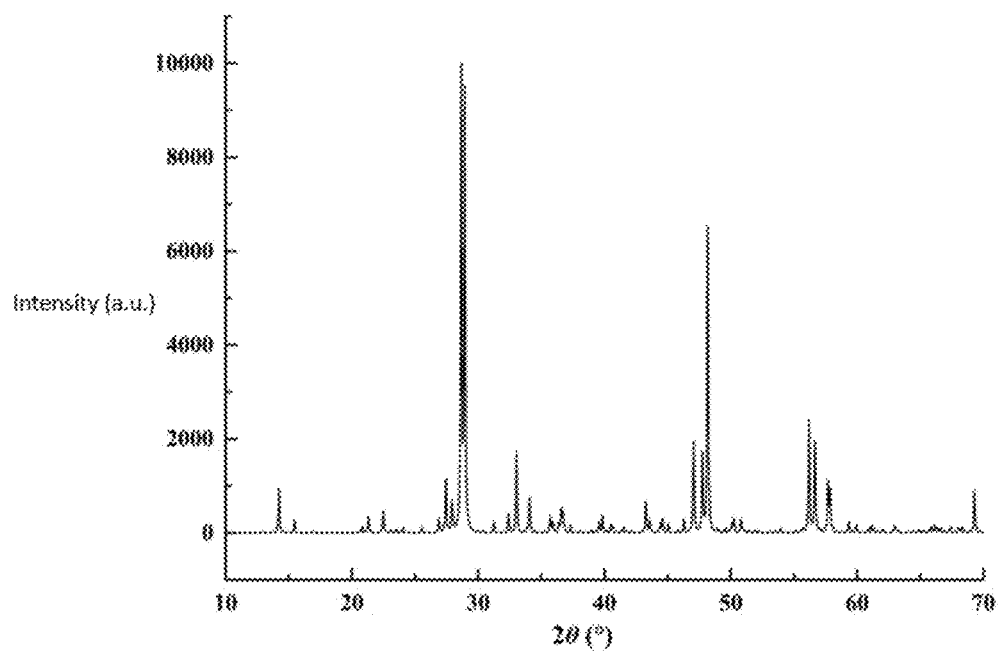
FIG. 1 is an X-ray powder diffraction pattern of a compound BaGa$_4$Se$_7$ of the present invention.
Figure 2:
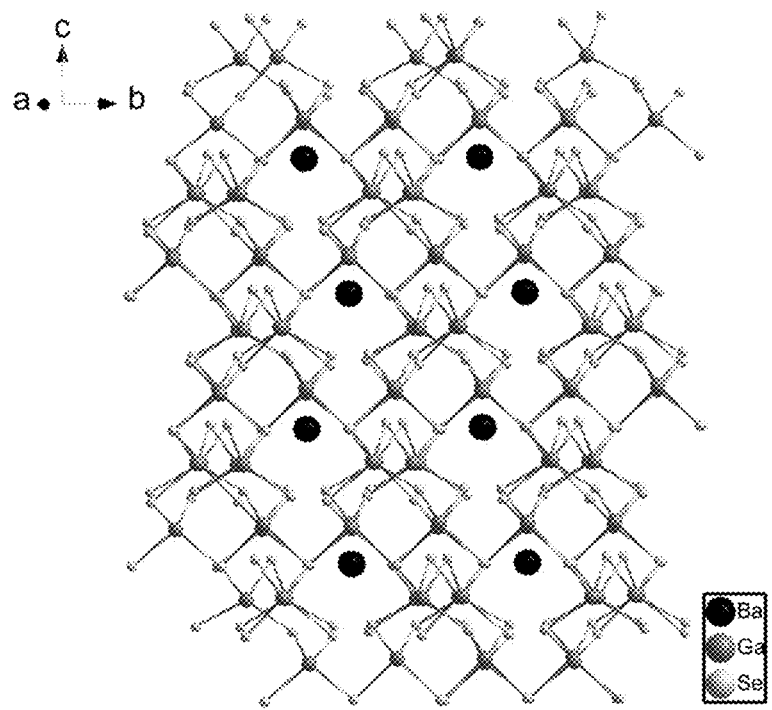
FIG. 2 is a structural diagram of a BaGa$_4$Se$_7$ crystal of the present invention.

The present invention is described above through specific embodiments, but the invention is not limited to these embodiments.

Embodiment 1

Orthogonal-phase BaGa$_4$Se$_7$ polycrystalline powder was prepared according to a reaction formula: Ba+4Ga+7Se→BaGa$_4$Se$_7$ as follows:

a, a barium single element, a gallium single element, and a selenium single element were uniformly mixed in a gas-tight container with water content and oxygen gas content of 0.05 ppm, specifically a glove box filled with inert gas argon gas in a molar ratio of 1:4:7 to obtain a mixture, then the mixture was put into a clean graphite crucible, the mixture was put into a quartz glass tube, and a quartz tube filled with raw materials was sealed after being vacuum-pumped under vacuum degree of 10$^{-3}$ Pa;

b, the quartz tube sealed in step a was heated up to 400° C. from the room temperature at a heat-up rate of 10°

C. per hour, the heat was preserved for 30 hours, and then the quartz tube was heated up to 800° C. at a heat-up rate of 20° C. per hour, and the heat was preserved for 70 hours; and c, the quartz tube was cooled to the room temperature at a cooling rate of 2° C. per hour, a sample was taken out to pulverize in a mortar box, and was ground to obtain a yellowish compound $BaGa_4Se_7$ polycrystalline powder, and X-ray analysis was performed on the obtained compound orthogonal-phase $BaGa_4Se_7$ polycrystalline powder, where an X-ray diffraction pattern was consistent with a theoretical X-ray diffraction pattern of $BaGa_4Se_7$ analyzed by a single-crystal structure.

Orthogonal-phase $BaGa_4Se_7$ polycrystalline powder was prepared according to a reaction formula: $Ba+4Ga+7Se \rightarrow BaGa_4Se_7$ as follows:

a, a barium single element, a gallium single element, and a selenium single element were uniformly mixed in a gas-tight container with water content and oxygen gas content of 0.05 ppm, specifically a glove box filled with inert gas argon gas in a molar ratio of 1:4:7 to obtain a mixture, then the mixture was put into a clean graphite crucible, the mixture was put into a quartz glass tube, and a quartz tube filled with raw materials was sealed after being vacuum-pumped under vacuum degree of $10^{-3}$ Pa;

b, the quartz tube sealed in step a was heated up to 400° C. from the room temperature at a heat-up rate of 10° C. per hour, the heat was preserved for 30 hours, and then the quartz tube was heated up to 900° C. at a heat-up rate of 20° C. per hour, and the heat was preserved for 70 hours; and c, the quartz tube was cooled to the room temperature at a cooling rate of 2° C. per hour, a sample was taken out of a graphite crucible to obtain a yellowish blocky orthogonal-phase selenium-gallium-barium $BaGa_4Se_7$ crystal, where the crystal was an orthogonal-phase $BaGa_4Se_7$ nonlinear optical crystal according to single-crystal X-ray diffraction analysis.

Embodiment 2

Compound orthogonal-phase $BaGa_4Se_7$ polycrystalline powder was prepared according to a reaction formula: $Ba+2Ga_2Se_3+Se \rightarrow BaGa_4Se_7$ as follows:

a, a barium single element, gallium selenide and a selenium single element were uniformly mixed in a gas-tight container with water content and oxygen gas content of 0.05 ppm, specifically a glove box filled with inert gas argon gas in a molar ratio of 1:2:1 to obtain a mixture, then the mixture was put into a clean graphite crucible, the mixture was put into a quartz glass tube, and a quartz tube filled with raw materials was sealed after being vacuum-pumped under vacuum degree of $10^{-3}$ Pa;

b, the quartz tube sealed in step a was heated up to 700° C. from the room temperature at a heat-up rate of 40° C. per hour, the heat was preserved for 60 hours, and then the quartz tube was heated up to 1000° C. at a heat-up rate of 40° C. per hour, and the heat was preserved for 110 hours; and c, the quartz tube was cooled to the room temperature at a cooling rate of 7° C. per hour, a sample was taken out to pulverize in a mortar box, and was ground to obtain a yellowish compound $BaGa_4Se_7$ polycrystalline powder, and X-ray analysis was performed on the obtained compound orthogonal-phase $BaGa_4Se_7$ polycrystalline powder, where an X-ray diffraction pattern was consistent with a theoretical X-ray diffraction pattern of $BaGa_4Se_7$ analyzed by a single-crystal structure.

A compound orthogonal-phase selenium-gallium-barium $BaGa_4Se_7$ nonlinear optical crystal was prepared according to a reaction formula: $Ba+2Ga_2Se_3+Se \rightarrow BaGa_4Se_7$ as follows:

a, a barium single element, gallium selenide ana selenium single element were uniformly mixed in a gas-tight container with water content and oxygen gas content of 0.05 ppm, specifically a glove box filled with inert gas argon gas in a molar ratio of 1:2:1 to obtain a mixture, then the mixture was put into a clean graphite crucible, the mixture was put into a quartz glass tube, and a quartz tube filled with raw materials was sealed after being vacuum-pumped under vacuum degree of $10^{-3}$ Pa;

b, the quartz tube sealed in step a was heated up to 700° C. from the room temperature at a heat-up rate of 40° C. per hour, the heat was preserved for 60 hours, and then the quartz tube was heated up to 1000° C. at a heat-up rate of 40° C. per hour, and the heat was preserved for 110 hours; and c, the quartz tube was cooled to the room temperature at a cooling rate of 5° C. per hour, a sample was taken out of a graphite crucible to obtain a yellowish blocky orthogonal-phase selenium-gallium-barium $BaGa_4Se_7$ crystal, where the crystal was an orthogonal-phase selenium-gallium-barium $BaGa_4Se_7$ nonlinear optical crystal according to single-crystal X-ray diffraction analysis.

Embodiment 3

Compound orthogonal-phase selenium-gallium-barium $BaGa_4Se_7$ polycrystalline powder was prepared according to a reaction formula: $BaSe+2Ga_2Se_3 \rightarrow BaGa_4Se_7$ as follows:

a, selenium barium and gallium selenide were uniformly mixed in a gas-tight container with water content and oxygen gas content of 0.05 ppm, specifically a glove box filled with inert gas argon gas in a molar ratio of 1:2 to obtain a mixture, then the mixture was put into a clean graphite crucible, the mixture was put into a quartz glass tube, and a quartz tube filled with raw materials was sealed after being vacuum-pumped under vacuum degree of $10^{-3}$ Pa;

b, the quartz tube sealed in step a was heated up to 500° C. from the room temperature at a heat-up rate of 20° C. per hour, the heat was preserved for 40 hours, and then the quartz tube was heated up to 850° C. at a heat-up rate of 30° C. per hour, and the heat was preserved for 80 hours; and c, the quartz tube was cooled to the room temperature at a cooling rate of 6° C. per hour, a sample was taken out to pulverize in a mortar box, and was ground to obtain a yellowish compound $BaGa_4Se_7$ polycrystalline powder, and X-ray analysis was performed on the obtained compound orthogonal-phase $BaGa_4Se_7$ polycrystalline powder, where an X-ray diffraction pattern was consistent with a theoretical X-ray diffraction pattern of $BaGa_4Se_7$ analyzed by a single-crystal structure.

A compound orthogonal-phase selenium-gallium-barium $BaGa_4Se_7$ nonlinear optical crystal was prepared according to a reaction formula: $Ba+2Ga_2Se_3+Se \rightarrow BaGa_4Se_7$ as follows:

a, selenium barium and gallium selenide were uniformly mixed in a gas-tight container with water content and oxygen gas content of 0.06 ppm, specifically a glove box filled with inert gas argon gas in a molar ratio of 1:2 to obtain a mixture, then the mixture was put into a clean graphite crucible, the mixture was put into a quartz glass tube, and a quartz tube filled with raw materials was sealed after being vacuum-pumped under vacuum degree of $10^{-3}$ Pa;

b, the quartz tube sealed in step a was heated up to 650° C. from the room temperature at a heat-up rate of 35° C. per hour, the heat was preserved for 35 hours, and then the quartz tube was heated up to 1050° C. at a heat-up rate of 35° C. per hour, and the heat was preserved for 90 hours; and c, the quartz tube was cooled to the room temperature at a cooling rate of 4° C. per hour, a sample was taken out of a graphite crucible to obtain a yellowish blocky orthogonal-phase selenium-gallium-barium $BaGa_4Se_7$ crystal, where the crystal was an orthogonal-phase selenium-gallium-barium $BaGa_4Se_7$ nonlinear optical crystal according to single-crystal X-ray diffraction analysis.

Embodiment 4

Compound orthogonal-phase selenium-gallium-barium $BaGa_4Se_7$ polycrystalline powder was prepared according to a reaction formula: $BaF_2+2Ga_2Se_3+1.5Se \rightarrow BaGa_4Se_7+ 0.5SeF_4\uparrow$ as follows:

a, barium fluoride, gallium selenide and a selenium single element were uniformly mixed in a gas-tight container with water content and oxygen gas content of 0.05 ppm, specifically a glove box filled with inert gas argon gas in a molar ratio of 1:2:1.5 to obtain a mixture, then the mixture was put into a clean graphite crucible, the mixture was put into a quartz glass tube, and a quartz tube filled with raw materials was sealed after being vacuum-pumped under vacuum degree of $10^{-3}$ Pa;

b, the quartz tube sealed in step a was heated up to 600° C. from the room temperature at a heat-up rate of 30° C. per hour, the heat was preserved for 25 hours, and then the quartz tube was heated up to 900° C. at a heat-up rate of 30° C. per hour, and the heat was preserved for 80 hours; and c, the quartz tube was cooled to the room temperature at a cooling rate of 6° C. per hour, a sample was taken out to pulverize in a mortar box, and was ground to obtain a yellowish compound $BaGa_4Se_7$ polycrystalline powder, and X-ray analysis was performed on the obtained compound orthogonal-phase selenium-gallium-barium $BaGa_4Se_7$ polycrystalline powder, where an X-ray diffraction pattern was consistent with a theoretical X-ray diffraction pattern of $BaGa_4Se_7$ analyzed by a single-crystal structure.

A compound orthogonal-phase selenium-gallium-barium $BaGa_4Se_7$ nonlinear optical crystal was prepared according to a reaction formula: $BaF_2+2Ga_2Se_3+1.5Se \rightarrow BaGa_4Se_7+ 0.5SeF_4\uparrow$ as follows:

a, barium fluoride, gallium selenide and a selenium single element were uniformly mixed in a gas-tight container with water content and oxygen gas content of 0.05 ppm, specifically a glove box filled with inert gas argon gas in a molar ratio of 1:2:1.5 to obtain a mixture, then the mixture was put into a clean graphite crucible, the mixture was put into a quartz glass tube, and a quartz tube filled with raw materials was sealed after being vacuum-pumped under vacuum degree of $10^{-3}$ Pa;

b, the quartz tube sealed in step a was heated up to 650° C. from the room temperature at a heat-up rate of 20° C. per hour, the heat was preserved for 30 hours, and then the quartz tube was heated up to 1000° C. at a heat-up rate of 30° C. per hour, and the heat was preserved for 100 hours; and c, the quartz tube was cooled to the room temperature at a cooling rate of 5° C. per hour, a sample was taken out of a graphite crucible to obtain a yellowish blocky orthogonal-phase selenium-gallium-barium $BaGa_4Se_7$ crystal, where the crystal was an orthogonal-phase selenium-gallium-barium $BaGa_4Se_7$ nonlinear optical crystal according to single-crystal X-ray diffraction analysis.

Embodiment 5

Compound orthogonal-phase selenium-gallium-barium $BaGa_4Se_7$ polycrystalline powder was prepared according to a reaction formula: $BaF_2+4Ga+7.5Se \rightarrow BaGa_4Se_7+ 0.5SeF_4\uparrow$ as follows:

a, barium fluoride, a gallium single element, and a selenium single element were uniformly mixed in a gas-tight container with water content and oxygen gas content of 0.05 ppm, specifically a glove box filled with inert gas argon gas in a molar ratio of 1:4:7.5 to obtain a mixture, then the mixture was put into a clean graphite crucible, the mixture was put into a quartz glass tube, and a quartz tube filled with raw materials was sealed after being vacuum-pumped under vacuum degree of $10^{-3}$ Pa;

b, the quartz tube sealed in step a was heated up to 500° C. from the room temperature a heat-up rate of 25° C. per hour, the heat was preserved for 35 hours, and then the quartz tube was heated up to 850° C. at a heat-up rate of 25° C. per hour, and the heat was preserved for 80 hours; and c, the quartz tube was cooled to the room temperature at a cooling rate of 5° C. per hour, a sample was taken out to pulverize in a mortar box, and was ground to obtain a yellowish compound $BaGa_4Se_7$ polycrystalline powder, and X-ray analysis was performed on the obtained compound orthogonal-phase selenium-gallium-barium $BaGa_4Se_7$ polycrystalline powder, where an X-ray diffraction pattern was consistent with a theoretical X-ray diffraction pattern of $BaGa_4Se_7$ analyzed by a single-crystal structure.

A compound orthogonal-phase selenium-gallium-barium $BaGa_4Se_7$ nonlinear optical crystal was prepared according to a reaction formula: $BaF_2+4Ga+7.5Se \rightarrow BaGa_4Se_7+ 0.5SeF_4\uparrow$ as follows:

a, barium fluoride, a gallium single element, and a selenium single element were uniformly mixed in a gas-tight container with water content and oxygen gas content of 0.05 ppm, specifically a glove box filled with inert gas argon gas in a molar ratio of 1:4:7.5 to obtain a mixture, then the mixture was put into a clean graphite crucible, the mixture was put into a quartz glass tube, and a quartz tube filled with raw materials was sealed after being vacuum-pumped under vacuum degree of $10^{-3}$ Pa;

b, the quartz tube sealed in step a was heated up to 550° C. at a heat-up rate of 5° C. per hour, the heat was preserved for 50 hours, and then the quartz tube was heated up to 950° C. at a heat-up rate of 25° C. per hour, and the heat was preserved for 90 hours; and c, the quartz tube was cooled to the room temperature at a cooling rate of 3° C. per hour, a sample was taken out of a graphite crucible to obtain a yellowish blocky orthogonal-phase selenium-gallium-barium BaGa$_4$Se$_7$ crystal, where the crystal was an orthogonal-phase selenium-gallium-barium BaGa$_4$Se$_7$ nonlinear optical crystal according to single-crystal X-ray diffraction analysis.

Embodiment 6

Compound orthogonal-phase selenium-gallium-barium BaGa$_4$Se$_7$ polycrystalline powder was prepared according to a reaction formula: BaCl$_2$+2Ga$_2$Se$_3$+1.5Se→BaGa$_4$Se$_7$+0.5SeCl$_4$↑ as follows:
 a, barium chloride, gallium selenide and a selenium single element were uniformly mixed in a gas-tight container with water content and oxygen gas content of 0.07 ppm, specifically a glove box filled with inert gas argon gas in a molar ratio of 1:2:1.5 to obtain a mixture, then the mixture was put into a clean graphite crucible, the mixture was put into a quartz glass tube, and a quartz tube filled with raw materials was sealed after being vacuum-pumped under vacuum degree of 10$^{-3}$ Pa;
 b, the quartz tube sealed in step a was heated up to 550° C. from the room temperature at a heat-up rate of 20° C. per hour, the heat was preserved for 40 hours, and then the quartz tube was heated up to 900° C. at a heat-up rate of 30° C. per hour, and the heat was preserved for 75 hours; and
 c, the quartz tube was cooled to the room temperature at a cooling rate of 6° C. per hour, a sample was taken out to pulverize in a mortar box, and was ground to obtain a yellowish compound BaGa$_4$Se$_7$ polycrystalline powder, and X-ray analysis was performed on the obtained compound orthogonal-phase selenium-gallium-barium BaGa$_4$Se$_7$ polycrystalline powder, where an X-ray diffraction pattern was consistent with a theoretical X-ray diffraction pattern of BaGa$_4$Se$_7$ analyzed by a single-crystal structure.

A compound orthogonal-phase selenium-gallium-barium BaGa$_4$Se$_7$ nonlinear optical crystal was prepared according to a reaction formula: BaCl$_2$+2Ga$_2$Se$_3$+1.5Se→BaGa$_4$Se$_7$+0.5SeCl$_4$↑ as follows:
 a, barium chloride, gallium selenide and a selenium single element were uniformly mixed in a gas-tight container with water content and oxygen gas content of 0.04 ppm, specifically a glove box filled with inert gas argon gas in a molar ratio of 1:2:1.5 to obtain a mixture, then the mixture was put into a clean graphite crucible, the mixture was put into a quartz glass tube, and a quartz tube filled with raw materials was sealed after being vacuum-pumped under vacuum degree of 10$^{-5}$-10$^{-1}$ Pa.
 b, the quartz tube sealed in step a was heated up to 600° C. at a heat-up rate of 30° C. per hour, the heat was preserved for 50 hours, and then the quartz tube was heated up to 1050° C. at a heat-up rate of 30° C. per hour, and the heat was preserved for 90 hours; and c, the quartz tube was cooled to the room temperature at a cooling rate of 2° C. per hour, a sample was taken out of a graphite crucible to obtain a yellowish blocky orthogonal-phase selenium-gallium-barium BaGa$_4$Se$_7$ crystal, where the crystal was an orthogonal-phase selenium-gallium-barium BaGa$_4$Se$_7$ nonlinear optical crystal according to single-crystal X-ray diffraction analysis.

Embodiment 7 orthogonal-phase selenium-gallium-barium BaGa$_4$Se$_7$ polycrystalline powder was prepared according to a reaction formula: BaCl$_2$+4Ga+7.5Se→BaGa$_4$Se$_7$+0.5SeCl$_4$↑ as follows:
 a, barium chloride, a gallium single element and a selenium single element were uniformly mixed in a gas-tight container with water content and oxygen gas content of 0.06 ppm, specifically a glove box filled with inert gas argon gas in a molar ratio of 1:4:7.5 to obtain a mixture, then the mixture was put into a clean graphite crucible, the mixture was put into a quartz glass tube, and a quartz tube filled with raw materials was sealed after being vacuum-pumped under vacuum degree of 10$^{-3}$ Pa;
 b, the quartz tube sealed in step a was heated up to 500° C. from the room temperature at a heat-up rate of 20° C. per hour, the heat was preserved for 50 hours, and then the quartz tube was heated up to 850° C. at a heat-up rate of 30° C. per hour, and the heat was preserved for 90 hours; and
 c, the quartz tube was cooled to the room temperature at a cooling rate of 5° C. per hour, a sample was taken out to pulverize in a mortar box, and was ground to obtain a yellowish compound BaGa$_4$Se$_7$ polycrystalline powder, and X-ray analysis was performed on the obtained compound orthogonal-phase selenium-gallium-barium BaGa$_4$Se$_7$ polycrystalline powder, where an X-ray diffraction pattern was consistent with a theoretical X-ray diffraction pattern of BaGa$_4$Se$_7$ analyzed by a single-crystal structure.

An orthogonal-phase selenium-gallium-barium BaGa$_4$Se$_7$ nonlinear optical crystal was prepared according to a reaction formula: BaC$_2$+4Ga+7.5Se→BaGa$_4$Se$_7$+0.5SeCl$_4$↑ as follows:
 a, barium chloride, a gallium single element and a selenium single element were uniformly mixed in a gas-tight container with water content and oxygen gas content of 0.01-0.1 ppm, specifically a glove box filled with inert gas argon gas in a molar ratio of 1:4:7.5 to obtain a mixture, then the mixture was put into a clean graphite crucible, the mixture was put into a quartz glass tube, and a quartz tube filled with raw materials was sealed after being vacuum-pumped under vacuum degree of 10$^{-5}$-10$^{-1}$ Pa.
 b, the quartz tube sealed in step a was heated up to 600° C. at a heat-up rate of 30° C. per hour, the heat was preserved for 30 hours, and then the quartz tube was heated up to 1150° C. at a heat-up rate of 30° C. per hour, and the heat was preserved for 90 hours; and
 c, the quartz tube was cooled to the room temperature at a cooling rate of 4° C. per hour, a sample was taken out of a graphite crucible to obtain a yellowish blocky orthogonal-phase selenium-gallium-barium BaGa$_4$Se$_7$ crystal, where the crystal was an orthogonal-phase selenium-gallium-barium BaGa$_4$Se$_7$ nonlinear optical crystal according to single-crystal X-ray diffraction analysis.

Embodiment 8

Compound orthogonal-phase selenium-gallium-barium BaGa$_4$Se$_7$ polycrystalline powder was prepared according to a reaction formula: BaBr$_2$+2Ga$_2$Se$_3$+1.5Se→BaGa$_4$Se$_7$+0.5SeBr$_4$↑ as follows:

a, barium bromide, gallium selenide and a selenium single element were uniformly mixed in a gas-tight container with water content and oxygen gas content of 0.05 ppm, specifically a glove box filled with inert gas argon gas in a molar ratio of 1:2:1.5 to obtain a mixture, then the mixture was put into a clean graphite crucible, the mixture was put into a quartz glass tube, and a quartz tube filled with raw materials was sealed after being vacuum-pumped under vacuum degree of $10^{-3}$ Pa;

b, the quartz tube sealed in step a was heated up to 600° C. from the room temperature at a heat-up rate of 30° C. per hour, the heat was preserved for 40 hours, and then the quartz tube was heated up to 1000° C. at a heat-up rate of 30° C. per hour, and the heat was preserved for 80 hours; and c, the quartz tube was cooled to the room temperature at a cooling rate of 3° C. per hour, a sample was taken out to pulverize in a mortar box, and was ground to obtain a yellowish compound $BaGa_4Se_7$ polycrystalline powder, and X-ray analysis was performed on the obtained compound orthogonal-phase selenium-gallium-barium $BaGa_4Se_7$ polycrystalline powder, where an X-ray diffraction pattern was consistent with a theoretical X-ray diffraction pattern of $BaGa_4Se_7$ analyzed by a single-crystal structure.

A compound orthogonal-phase selenium-gallium-barium $BaGa_4Se_7$ nonlinear optical crystal was prepared according to a reaction formula: $BaBr_2+2Ga_2Se_3+1.5Se \rightarrow BaGa_4Se_7+0.5SeBr_4\uparrow$ as follows:

a, barium bromide, gallium selenide and a selenium single element were uniformly mixed in a gas-tight container with water content and oxygen gas content of 0.03 ppm, specifically a glove box filled with inert gas argon gas in a molar ratio of 1:2:1.5 to obtain a mixture, then the mixture was put into a clean graphite crucible, the mixture was put into a quartz glass tube, and a quartz tube filled with raw materials was sealed after being vacuum-pumped under vacuum degree of $10^{-3}$ Pa;

b, the quartz tube sealed in step a was heated up to 700° C. at a heat-up rate of 20° C. per hour, the heat was preserved for 60 hours, and then the quartz tube was heated up to 1100° C. at a heat-up rate of 30° C. per hour, and the heat was preserved for 90 hours; and c, the quartz tube was cooled to the room temperature at a cooling rate of 2° C. per hour, a sample was taken out of a graphite crucible to obtain a yellowish blocky orthogonal-phase selenium-gallium-barium $BaGa_4Se_7$ crystal, where the crystal was an orthogonal-phase selenium-gallium-barium $BaGa_4Se_7$ nonlinear optical crystal according to single-crystal X-ray diffraction analysis.

Embodiment 9

Compound orthogonal-phase selenium-gallium-barium $BaGa_4Se_7$ polycrystalline powder was prepared according to a reaction formula: $BaBr_2+4Ga+7.5Se \rightarrow BaGa_4Se_7+0.5SeBr_4\uparrow$ as follows:

a, barium bromide, a gallium single element and a selenium single element were uniformly mixed in a gas-tight container with water content and oxygen gas content of 0.06 ppm, specifically a glove box filled with inert gas argon gas in a molar ratio of 1:4:7.5 to obtain a mixture, then the mixture was put into a clean graphite crucible, the mixture was put into a quartz glass tube, and a quartz tube filled with raw materials was sealed after being vacuum-pumped under vacuum degree of $10^{-3}$ Pa;

b, the quartz tube sealed in step a was heated up to 700° C. from the room temperature at a heat-up rate of 20° C. per hour, the heat was preserved for 30 hours, and then the quartz tube was heated up to 900° C. at a heat-up rate of 20° C. per hour, and the heat was preserved for 80 hours; and c, the quartz tube was cooled to the room temperature at a cooling rate of 3° C. per hour, a sample was taken out to pulverize in a mortar box, and was ground to obtain a yellowish compound $BaGa_4Se_7$ polycrystalline powder, and X-ray analysis was performed on the obtained compound orthogonal-phase selenium-gallium-barium $BaGa_4Se_7$ polycrystalline powder, where an X-ray diffraction pattern was consistent with a theoretical X-ray diffraction pattern of $BaGa_4Se_7$ analyzed by a single-crystal structure.

An orthogonal-phase selenium-gallium-barium $BaGa_4Se_7$ nonlinear optical crystal was prepared according to a reaction formula: $BaBr_2+4Ga+7.5Se \rightarrow BaGa_4Se_7+0.5SeBr_4\uparrow$ as follows:

A, barium bromide, a gallium single element and a selenium single element were uniformly mixed in a gas-tight container with water content and oxygen gas content of 0.05 ppm, specifically a glove box filled with inert gas argon gas in a molar ratio of 1:4:7.5 to obtain a mixture, then the mixture was put into a clean graphite crucible, the mixture was put into a quartz glass tube, and a quartz tube filled with raw materials was sealed after being vacuum-pumped under vacuum degree of $10^{-5}$-$10^{-1}$ Pa.

b, the quartz tube sealed in step a was heated up to 700° C. at a heat-up rate of 20° C. per hour, the heat was preserved for 30 hours, and then the quartz tube was heated up to 1100° C. at a heat-up rate of 20° C. per hour, and the heat was preserved for 90 hours; and c, the quartz tube was cooled to the room temperature at a cooling rate of 2° C. per hour, a sample was taken out of a graphite crucible to obtain a yellowish blocky orthogonal-phase selenium-gallium-barium $BaGa_4Se_7$ crystal, where the crystal was an orthogonal-phase selenium-gallium-barium $BaGa_4Se_7$ nonlinear optical crystal according to single-crystal X-ray diffraction analysis.

Embodiment 10

Figure 3:
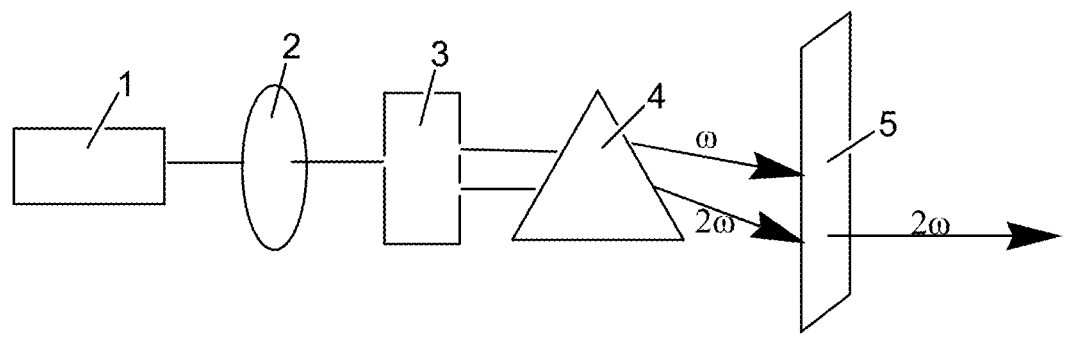
FIG. 3 is a working schematic diagram of a nonlinear optical apparatus manufactured from BaGa$_4$Se$_7$ crystal of the present invention, where 1 is a laser device, 2 is an emitted light beam, 3 is a BaGa$_4$Se$_7$ crystal, 4 is an outgoing light beam and 5 is a light filter.

Any orthogonal-phase selenium-gallium-barium $BaGa_4Se_7$ nonlinear optical crystal obtained according to embodiments 1 to 9 was mounted on the position of 3 as shown in FIG. 3; a Q-switched Nd: YAG laser device was taken as a light source with an incident wavelength of 2090 nm at room temperature. An infrared light beam 2 with a wavelength of 2090 nm emitted by the Q-switched Nd: YAG laser device 1 came into a $BaGa_4Se_7$ single crystal 3 to generate frequency doubled laser with a wavelength of 1045 nm and output strength is 5 times that of AGS under the same condition; and an outgoing beam 4 contained infrared light with a wavelength of 2090 nm and light with a wavelength of 1045 nm, and frequency doubled laser with a wavelength of 1045 nm was obtained after the light was filtered by a light filter 5.

What is claimed is:

1. A compound with a chemical formula of $BaGa_4Se_7$ and has an orthorhombic crystal phase having a non-centrosymmetric structure, point group mm2, with unit-cell parameters a=15.438(12) Å, b=7.610(6) Å, c=10.521(7) Å, Z=2 and V=1236.23(16) Å$^3$ and a molecular weight of 968.94 g.

2. A preparation method for the orthogonal-phase BaGa$_4$Se$_7$ compound according to claim 1, comprising the following steps: performing a solid-phase reaction method after mixing a barium-containing compound or a barium single element, a gallium-containing compound or a gallium single element, a selenium-containing compound or a selenium single element to obtain the orthogonal-phase BaGa$_4$Se$_7$ compound, wherein the barium-containing compound or the barium single element, the gallium-containing compound or the gallium single element and the selenium-containing compound or the selenium single element are in a molar ratio of 0.8-1.2:3.8-4.2:6.8-7.5; the barium-containing compound comprises at least one of barium fluoride, barium chloride, barium bromide and barium selenide; the gallium-containing compound includes at least one of gallium fluoride, gallium chloride, gallium bromide and gallium selenide; and the selenium-containing compound includes at least one of barium selenide and gallium selenide.

3. The preparation method for the orthogonal-phase BaGa$_4$Se$_7$ compound according to claim 2, wherein the orthogonal-phase BaGa$_4$Se$_7$ compound is prepared by a high-temperature solid-phase reaction method comprising the following steps:
   a, uniformly mixing a barium-containing compound or a barium single element, a gallium-containing compound or a gallium single element, a selenium-containing compound or a selenium single element in a gas-tight container with water content and oxygen gas content of 0.01-0.1 ppm, specifically a glove box filled with inert gas argon gas in a molar ratio of 1:4:7 to obtain a mixture, then putting the mixture into a clean graphite crucible, filling the mixture into a quartz glass tube, and sealing after vacuum-pumping a quartz tube filled with raw materials under vacuum degree of $10^{-5}$-$10^{-1}$ Pa;
   b, heating up the quartz tube sealed in step a to 400-700° C. from the room temperature at a heat-up rate of 10-40° C. per hour, preserving the heat for 30-60 hours, and then heating up the quartz tube to 800-1000° C. at a heat-up rate of 20-40° C. per hour, and preserving the heat for 70-100 hours; and
   c, cooling the quartz tube to the room temperature at a cooling rate of 2-7° C. per hour, taking out a sample to pulverize in a mortar box, and grinding to obtain compound BaGa$_4$Se$_7$ polycrystalline powder, and performing X-ray analysis on the obtained orthogonal-phase BaGa$_4$Se$_7$ compound polycrystalline powder, wherein an X-ray diffraction pattern is consistent with a theoretical X-ray diffraction pattern of BaGa$_4$Se$_7$ analyzed by a single-crystal structure.

4. A nonlinear optical (NLO) crystal has a chemical formula of BaGa$_4$Se$_7$ with a molecular weight of 968.94 g, is an orthorhombic crystal, point group mm2 as β-BaGa$_4$Se$_7$, with unit-cell parameters a=15.438(12) Å, b=7.610(6) Å, c=10.521(7) Å, Z=2 and V=1236.23(16) Å$^3$, β-BaGa$_4$Se$_7$ has a powder second harmonic generation (SHG) intensity of about 5 times that of AgGaS2 and is phase-matched to AgGaS2, wherein the nonlinear optical crystal is transparent in the wavelength range of 0.44-25 μm.

5. A preparation method for the BaGa$_4$Se$_7$ nonlinear optical crystal according to claim 4, wherein the nonlinear optical crystal adopts a sealing tube high-temperature solution method or a Bridgman method (descending crucible method) based on the following specific operation steps:

a, In a glove box filled with the inert gas argon and water content and oxygen gas content of 0.01-0.1 ppm, the compound BaGa$_4$Se$_7$ polycrystalline powder or the mixture of compound BaGa$_4$Se$_7$ polycrystalline powder and flux obtained in claim 3 is placed in a clean graphite crucible, then the graphite crucible is filled with a quartz tube, and finally the quartz tube is sealed by evacuation with a vacuum degree of $10^{-5}$-$10^{-1}$ Pa;
   or directly putting a mixture of a barium-containing compound or a barium single element, a gallium-containing compound or a gallium single element, a selenium-containing compound or a selenium single element and a fluxing agent into a clean graphite crucible, filling the mixture into a quartz glass tube, and sealing after vacuum-pumping a quartz tube filled with raw materials under vacuum degree of $10^{-5}$-$10^{-1}$ Pa,
   b, heating up the quartz tube sealed in step a to 400-700° C. from the room temperature at a heat-up rate of 10-40° C. per hour, preserving the heat for 30-60 hours, and then heating up the quartz tube to 900-1100° C. at a heat-up rate of 20-40° C. per hour, and preserving the heat for 70-110 hours; and
   c. cooling the quartz tube to the room temperature at a cooling rate of 2-5° C. per hour to obtain a BaGa$_4$Se$_7$ crystal;
   or putting a crucible containing a mixture prepared in step a into a crystal growth furnace, slowly dropping the crystal growth furnace, making the crucible pass through a heating furnace with certain temperature gradient, and controlling the furnace temperature to be a bit higher than a material melting point; selecting a proper heating region, melting materials in the crucible while the crucible passing through the heating region, vertically dropping the crystal growth device at a rate of 0.1-10 mm/h, firstly reducing the temperature at the bottom of the crucible to be lower than the melting point while the crucible continuously drops, starting crystallization, continuously growing the crystal along with drop of the crucible, thereby preparing a BaGa$_4$Se$_7$ crystal, wherein a growth period lasts for 5-20 days.

6. The method according to claim 5, wherein a molar ratio of the compound orthogonal-phase BaGa$_4$Se$_7$ single-phase polycrystalline powder to the fluxing agent is (1-1.2) to (0-20); or a molar ratio of a barium-containing compound or a barium single element, a gallium-containing compound or a gallium single element, a selenium-containing compound or a selenium single element and a fluxing agent is (1-1.1) to (4-4.1) to (7-7.5) to (0-20); the fluxing agent comprises at least one of a selenium single element, gallium selenide, barium selenide, selenium fluoride, selenium chloride, selenium bromide as well as one or more of the following composite fluxing agents:
   Se—Ga$_2$Se$_3$, Se—BaSe, Se—Ga$_2$Se$_3$—BaSe, SeF$_4$—Ga$_2$Se$_3$, SeF$_4$—BaSe, SeF$_4$—Ga$_2$Se$_3$—BaSe, SeCl$_4$—Ga$_2$Se$_3$, SeCl$_4$—BaSe, SeCl$_4$—Ga$_2$Se$_3$—BaSe, SeBr$_4$—Ga$_2$Se$_3$, SeBr$_4$—BaSe, SeBr$_4$—Ga$_2$Se$_3$—BaSe, Se—SeF$_4$, Se—SeCl$_4$, Se—SeBr$_4$ and Ga$_2$Se$_3$—BaSe.

7. The method according to claim 6, wherein a molar ratio of Se to Ga$_2$Se$_3$ in a composite flux Se—Ga$_2$Se$_3$ system is (1-3) to (1-3); a molar ratio of Se to BaSe in a Se—BaSe system is (1-3) to (1-2); a molar ratio of Se to Ga$_2$Se$_3$ to BaSe in a Se—Ga$_2$Se$_3$—BaSe system is (1-3) to (1-3) to (1-2); a molar ratio of SeF$_4$ to Ga$_2$Se$_3$ in a SeF$_4$—Ga$_2$Se$_3$ system is (1-3) to (1-3); a molar ratio of SeF$_4$ to BaSe in a SeF$_4$—BaSe system is (1-3) to (1-2); a molar ratio of SeF$_4$ to $Ga_2Se_3$ to BaSe in a $SeF_4$—$Ga_2Se_3$—BaSe system is (1-3) to (1-3) to (1-2); a molar ratio of $SeCl_4$ to BaSe in a $SeCl_4$—BaSe system is (1-3) to (1-2); a molar ratio of $SeCl_4$ to BaSe in a $SeCl_4$—BaSe system is (1-3) to (1-2); and a molar ratio of $SeCl_4$ to $Ga_2Se_3$ to BaSe in a $SeCl_4$—$Ga_2Se_3$—BaSe system is (1-3) to (1-3) to (1-2).

8. Use of the orthogonal-phase $BaGa_4Se_7$ nonlinear optical crystal according to claim 4 in manufacturing an infrared communication apparatus, an infrared-waveband laser frequency doubling crystal, an infrared laser guiding apparatus, an upper frequency converter, a lower frequency converter or an optical parametric oscillator.

* * * * *